United States Patent
Hsiao et al.

(10) Patent No.: US 7,646,244 B1
(45) Date of Patent: Jan. 12, 2010

(54) APPARATUS AND METHOD FOR UNITY GAIN BUFFER WITH HIGH SWITCHING SPEED AND LOW QUIESCENT CURRENT

(75) Inventors: Chang Chia Hsiao, San Jose, CA (US); Dinh Nguyen, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 1 day.

(21) Appl. No.: 12/179,458

(22) Filed: Jul. 24, 2008

(51) Int. Cl.
*H03F 3/26* (2006.01)

(52) U.S. Cl. ........................... 330/267; 330/263
(58) Field of Classification Search ............ 330/267, 330/263
See application file for complete search history.

(56) References Cited

U.S. PATENT DOCUMENTS

| | | | | |
|---|---|---|---|---|
| 5,479,133 A | * | 12/1995 | Dow | 330/267 |
| 5,821,812 A | * | 10/1998 | Park et al. | 330/260 |
| 5,859,566 A | * | 1/1999 | Voorman et al. | 330/252 |
| 6,052,025 A | | 4/2000 | Chang et al. | |
| 6,052,028 A | * | 4/2000 | Heaton | 330/263 |
| 6,288,609 B1 | * | 9/2001 | Brueske et al. | 330/129 |
| 6,374,043 B1 | * | 4/2002 | El-Sherif et al. | 388/801 |
| 6,750,715 B2 | * | 6/2004 | Allott et al. | 330/258 |

OTHER PUBLICATIONS

LME49600, "High Performance, High Fidelity, High Current Audio Buffer," National Semiconductor Corporation, Mar. 31, 2008, pp. 1-20.

* cited by examiner

*Primary Examiner*—Patricia Nguyen
(74) *Attorney, Agent, or Firm*—Darby & Darby P.C.; Matthew M. Gaffney

(57) ABSTRACT

A unity gain buffer is provided. The unity gain buffer includes two complementary pairs of emitter followers and two bias current sources. The top bias current source is arranged to provide a bias current so that, if the input voltage is greater than zero, the bias current provided by the top current source increases at the input voltage increases. The bottom current source is arranged to provide a bias current so that, if the input voltage is less than zero, the bias current provided by the bottom current source decreases as the input voltage decreases.

15 Claims, 5 Drawing Sheets

APPARATUS AND METHOD FOR UNITY GAIN BUFFER WITH HIGH SWITCHING SPEED AND LOW QUIESCENT CURRENT

FIELD OF THE INVENTION

The invention is related to unity gain buffers, and in particular, to an apparatus and method for a unity gain buffer that adjusts the bias current provided to base-emitter junctions in the unity gain buffer based on changes to the input voltage.

BACKGROUND OF THE INVENTION

A unity gain buffer may be used to provide high current driving capability while keeping the ratio of output voltage to input voltage close to unity. Desired characteristics for a unity gain buffer design are listed below:
1. Capable of delivering high current to output load.
2. High output switching speed.
3. Output voltage to input voltage ratio close to unity.
4. Low quiescent current.

However, improving the characteristics numbered 1-3 above generally require high quiescent current, and therefore improving characteristics 1-3 above are generally done at the expense of characteristic 4 (low quiescent current) above.

BRIEF DESCRIPTION OF THE DRAWINGS

Non-limiting and non-exhaustive embodiments of the present invention are described with reference to the following drawings, in which.

DETAILED DESCRIPTION

Figure 1:
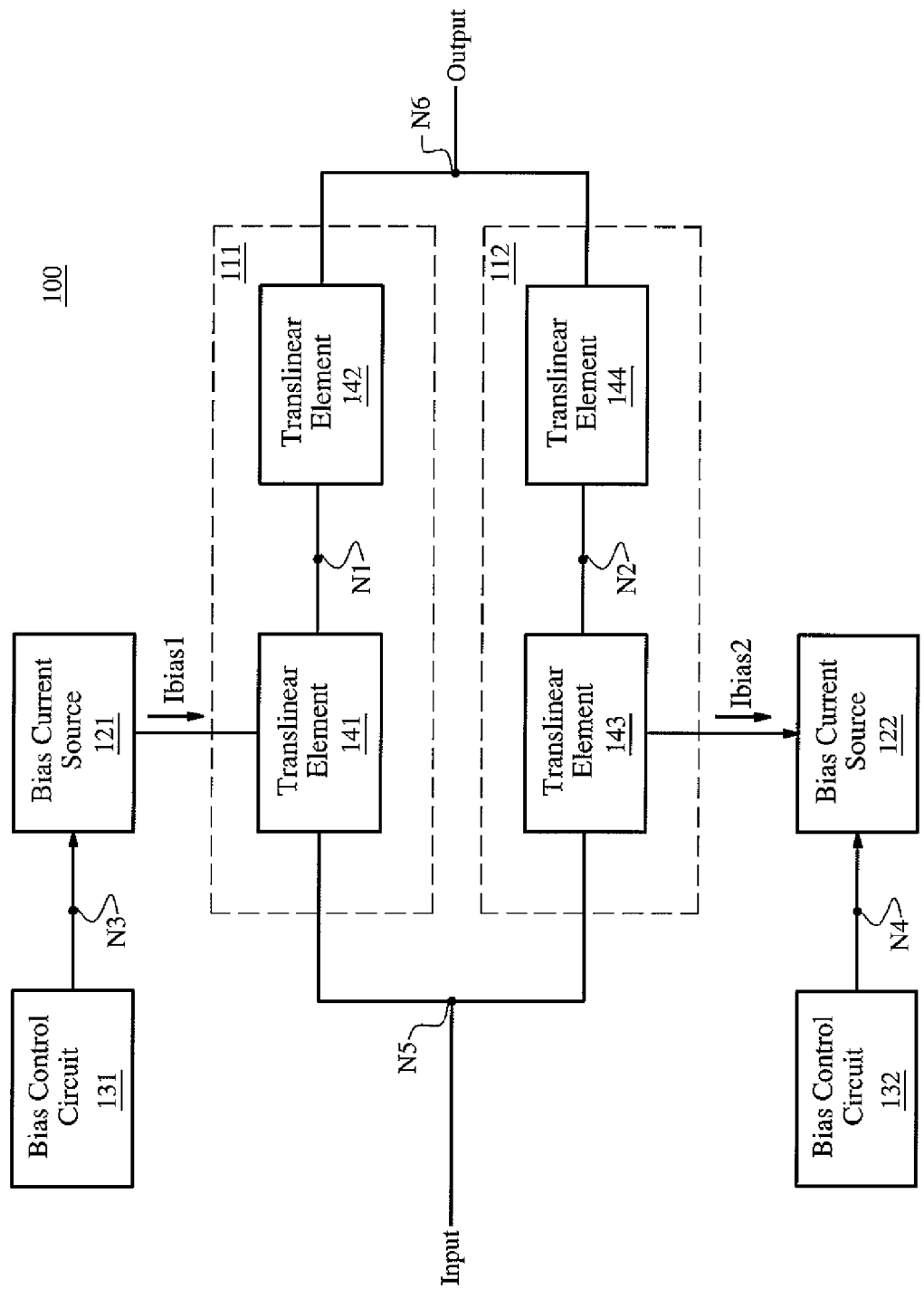
FIG. 1 shows a block diagram of a unity gain buffer.

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context dictates otherwise. The meanings identified below do not necessarily limit the terms, but merely provide illustrative examples for the terms. The meaning of "a," "an," and "the" includes plural reference, and the meaning of "in" includes "in" and "on." The phrase "in one embodiment," as used herein does not necessarily refer to the same embodiment, although it may. Similarly, the phrase "in some embodiments," as used herein, when used multiple times, does not necessarily refer to the same embodiments, although it may. As used herein, the term "or" is an inclusive "or" operator, and is equivalent to the term "and/or," unless the context clearly dictates otherwise. The term "based, in part, on", "based, at least in part, on", or "based on" is not exclusive and allows for being based on additional factors not described, unless the context clearly dictates otherwise. The term "coupled" means at least either a direct electrical connection between the items connected, or an indirect connection through one or more passive or active intermediary devices. The term "circuit" means at least either a single component or a multiplicity of components, either active and/or passive, that are coupled together to provide a desired function. The term "signal" means at least one current, voltage, charge, temperature, data, or other signal. Where either a field effect transistor (FET) or a bipolar junction transistor (BJT) may be employed as an embodiment of a transistor, the scope of the words "gate", "drain", and "source" includes "base", "collector", and "emitter", respectively, and vice versa.

Briefly stated, the invention is related to a unity gain buffer that includes two complementary pairs of emitter followers and two bias current sources. The top bias current source is arranged to provide a bias current so that, if the input voltage is greater than zero, the bias current provided by the top current source increases at the input voltage increases. The bottom current source is arranged to provide a bias current so that, if the input voltage is less than zero, the bias current provided by the bottom current source decreases at the input voltage decreases.

FIG. 1 shows a block diagram of unity gain buffer 100. Unity gain buffer 100 includes bias current sources 121 and 122, bias control circuits 131 and 132, and translinear loops 111 and 112. Translinear loop 111 includes translinear elements 141 and 142. Similarly, translinear loop 112 includes translinear elements 143 and 144.

In operation, translinear loops 111 and 112 cause output voltage Output to follow the input voltage Input so that the output voltage Output is substantially the same as the input voltage Input. Bias current source 121 is arranged to provide bias current Ibias1 to translinear loop 111, and bias current source 122 is arranged to provide bias current Ibias2 to translinear loop 112.

Further, bias currents Ibias1 and Ibias2 should be sufficiently strong so that the output stage (translinear elements 142 and 144) is capable of both sourcing (sinking) current and keeping the output voltage high enough to satisfy unity gain requirement. This is accomplished by adjusting currents Ibias1 and Ibias2 based on input voltage Input. Bias control circuit 131 is arranged to adjust bias current source 121 so that, if input voltage Input is greater than zero, Ibias1=A+B*Input, where A and B are positive constants. If input voltage Input is zero volts or less, Ibias1=A. This way, if input voltage Input is greater than zero, bias current Ibias1 includes a component that is proportional to input voltage Input. Accordingly, as input voltage Input increases to higher positive values, Ibias1 is high enough that transistor Q2 has enough drive strength to pull up the output voltage Output to the input voltage Input without increasing the quiescent current.

Similarly, bias control circuit 132 is arranged to adjust bias current source 122 so that, if input voltage Input is less than zero, Ibias2=A+B*|Input|, where A and B are positive constants. If input voltage Input is zero volts or more, Ibias2=A. Accordingly, as input voltage Input decreases to lower negative values, Ibias2 is high enough that transistor Q4 has enough drive strength to pull down the output voltage Output to the input voltage Input without increasing the quiescent current. The output stage (translinear elements 142 and 144) can source and sink high currents as needed for the output voltage to follow the input voltage over a wide voltage swing, without increasing the quiescent current.

Figure 2:
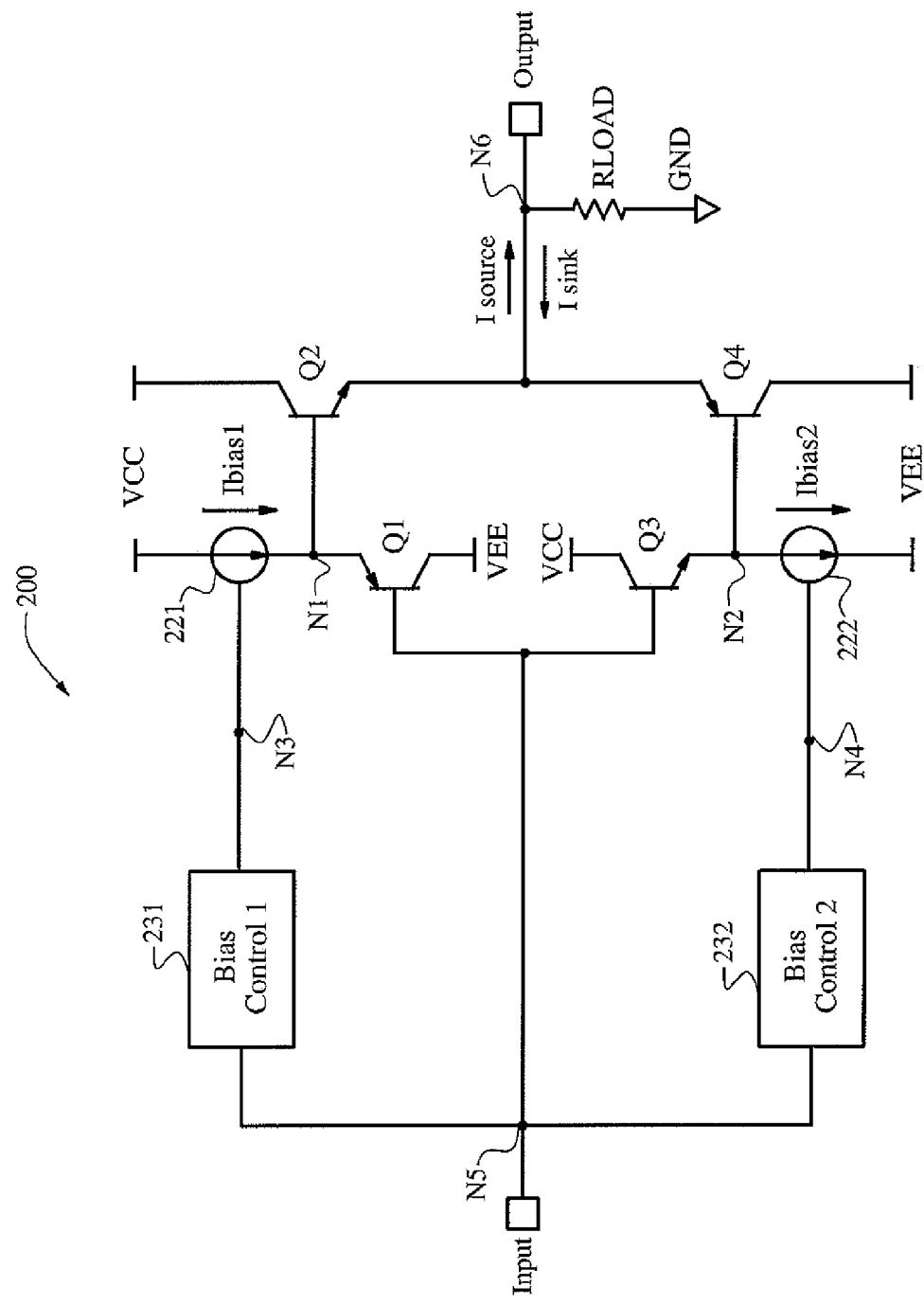
FIG. 2 illustrates a block diagram of an embodiment of the unity gain buffer of FIG. 1.

FIG. 2 illustrates a block diagram of an embodiment of unity gain buffer 200 driving a load represented by RLOAD. Unity gain buffer 200 may be employed as an embodiment of unity gain buffer 100 of FIG. 1. Unity gain buffer 200 includes transistors Q1-Q4, bias current sources 121 and 122, and bias control circuits 131 and 132. In unity gain buffer 200, the base-emitter junction of transistor Q1 is an embodiment of translinear element 141, the base-emitter junction of transistor Q2 is an embodiment of translinear element 142, the base-emitter junction of transistor Q3 is an embodiment of translinear element 143, and the base-emitter junction of transistor Q4 is an embodiment of translinear element 144.

Transistors Q1-Q2 and Q3-Q4 form two complementary pairs of emitter followers, allowing output voltage Output to follow input voltage Input and keep the output voltage magnitude close to that of the input voltage. Bias current source 221 is arranged to provide bias current Ibias1 to Q1-Q2. Similarly, bias current source 222 is arranged to provide bias current Ibias2 to Q3-Q4.

Although bias control circuit 231 and bias control circuit 232 are each shown as having an input that is connected the input voltage Input at node N5, this need not literally be the case, although it may be in some embodiments. The input is shown at node N5 to illustrate that the output of the bias control circuit is changed based on input voltage Input. However, the input of the bias control circuit need not be directly connected to node N5, as long as the bias control circuit controls the bias current based on input voltage Input in the manner discussed above. For example, in one embodiment, bias control circuit 231 is arranged to detect changes in input voltage input for a positively-going input based on changes in the collector current of Q1 and bias control circuit 232 is arranged to detect changes in input voltage Input for a negatively-going input based on changes in the collector current of Q3. These embodiments and others are within the scope and spirit of the invention.

Figure 3:
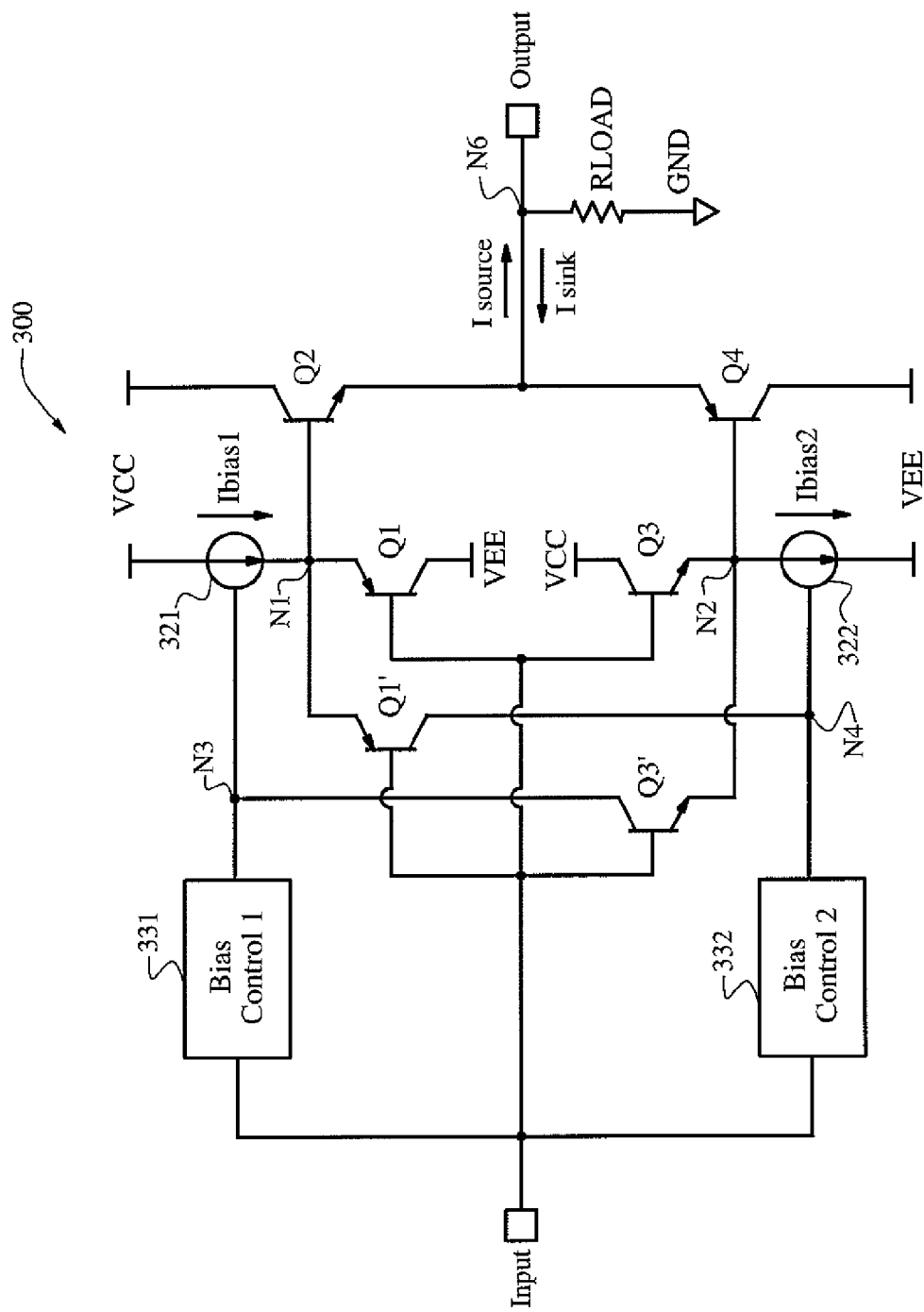
FIG. 3 shows a block diagram of an embodiment of the unity gain buffer of FIG. 2.

FIG. 3 shows a block diagram of an embodiment of unity gain buffer 300 driving a load represented by RLOAD. Unity gain buffer 300 may be employed as an embodiment of unity gain buffer 200 of FIG. 2. Unity gain buffer 300 further includes transistor Q1' and transistor Q3'.

Transistors Q1' and Q3' are arranged to increase the magnitude of currents Ibias1 or Ibias2 during output switching, accordingly increasing the switching speed.

For a positively going input signal, a negative pulse is generated at node N3, which temporarily increases current Ibias1 and the base current of transistor Q2, making Q2 stronger. Additionally, increased current on transistor Q3' reduces the base current of transistor Q4, making transistor Q4 weaker. These two mechanisms cause output voltage Output to be quickly switched from low to high. Both the negative pulse at node N3 and the reduction in base current of transistor Q4 are relatively brief; the duration of these temporary changes is over when the output switching is complete.

For a negatively going input signal, a positive pulse is generated at node N4, which temporarily increases current Ibias2 and the base current of transistor Q4, making transistor Q4 stronger. Additionally, increased current on Q1' reduces base current of transistor Q2, making transistor Q2 weaker. These two mechanisms cause output voltage Output to be quickly switched from high to low.

In either case, the pulses generated on nodes N3 and N4 caused by transistor Q3' and Q1' last for a relatively short period of time. After switching, Q1' and Q3' no longer adjust nodes N3 and N4.

In one embodiment, bias control circuits (331 and 332) are arranged to cause a delay in the change caused at their output based on changes in input voltage Input. In one embodiment, the delay is longer than the duration of the pulse caused by transistor Q1' and transistor Q3'. This way, the increase to switching speed caused by transistors Q1' and Q3' are not affected by the bias controls circuits 331 and 332.

Transistors Q1' and Q3' enable nodes N1 and N2 to be charged and discharged relatively quickly in order to achieve high switching speeds. Nodes N1 and N2 are both heavily capacitively loaded. However, transistors Q1' and Q3' enable relatively fast switching speed without increasing quiescent current.

Figure 4:
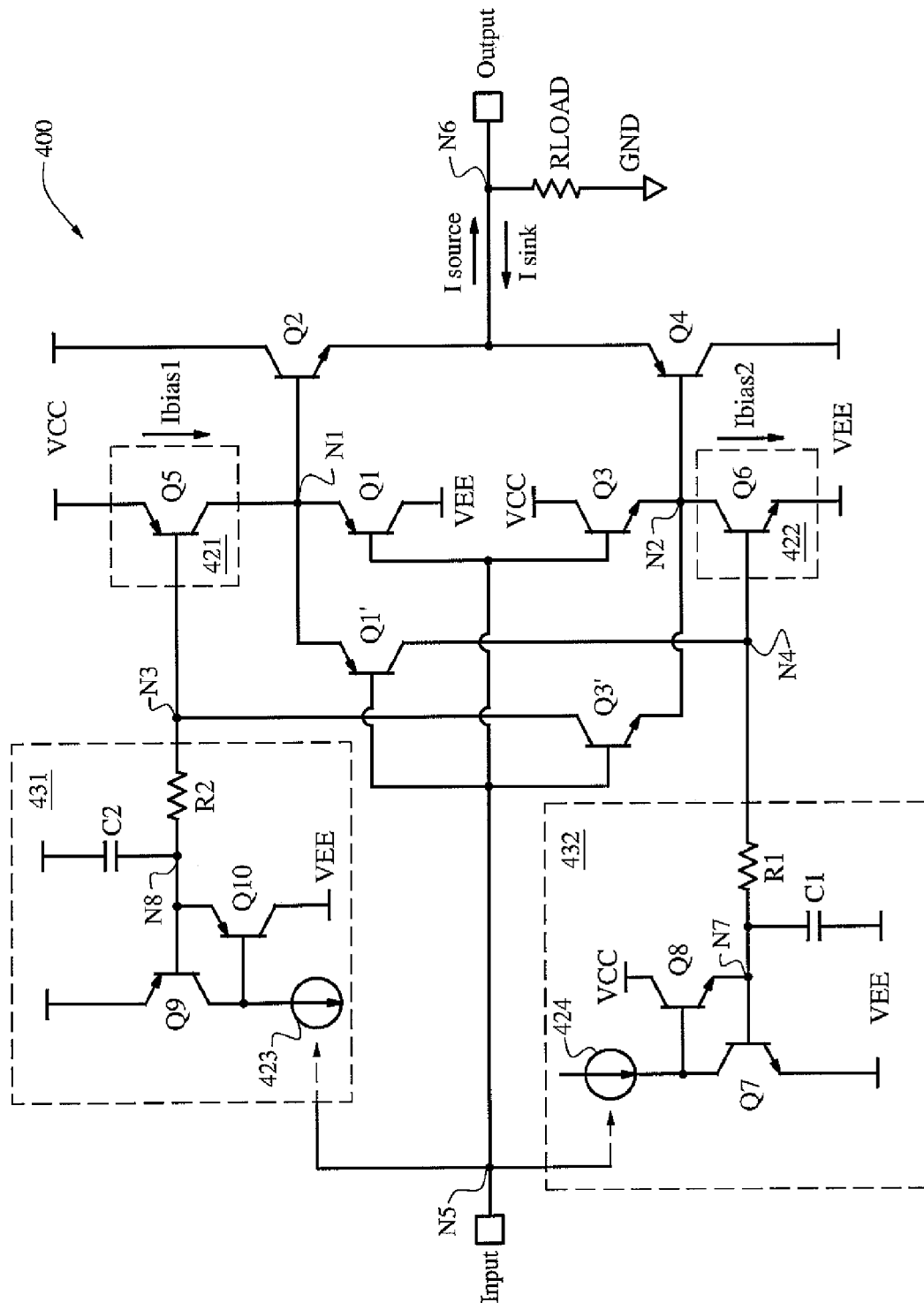
FIG. 4 illustrates a block diagram of an embodiment of the unity gain buffer of FIG. 3.

FIG. 4 illustrates a block diagram of an embodiment of unity gain buffer 400 driving a load represented by RLOAD. Unity gain buffer 400 may be employed as an embodiment of unity gain buffer 300 of FIG. 3. Bias control circuit 431 includes resistor R2, capacitor C2, transistor Q9, transistor Q10, and adjustable current source 423. Similarly, bias control circuit 432 includes resistor R1, capacitor C1, transistor Q7, transistor Q8, and adjustable current source 424.

Resistor R1 and capacitor C1 are arranged to operate as a low-pass filter that provides a delay, isolating the voltage at node N7 from the voltage at node N4. This delay allows the changes in the voltage at node N4 caused by transistor Q1' to not be affected by the operation of bias control circuit 432. Transistor Q1' generates a relatively brief positive voltage pulse at node N4 for a negatively going input signal, allowing the change in output voltage Output to occur more quickly. The low-pass filter (formed by R1 and C1) creates a delay which causes the effect of bias control circuit 432 to the change in output voltage Output to not occur until after the positive voltage pulse caused by transistor Q1' has ended.

Adjustable current source 424 is arranged to provide a voltage that is substantially constant if input voltage Input is zero or greater. If input voltage Input is less than zero, then the current provided by adjustable current source 424 is the substantially constant current plus an additional current component that is proportional to the magnitude of input voltage Input. The current provided by adjustable current source 424 is mirrored by Q7/Q6 to provide current Ibias2, subject to the isolation and delay caused by low-pass filter R1/C1 as discussed above. Transistor Q8 biases transistor Q7 to ensure that transistor Q7 is on.

Bias control circuit 432 operates in a similar manner, albeit different, to that discussed above with regard to bias control circuit 431. Resistor R2 and capacitor C2 form a low-pass filter that isolates node N8 from node N3.

Figure 5:
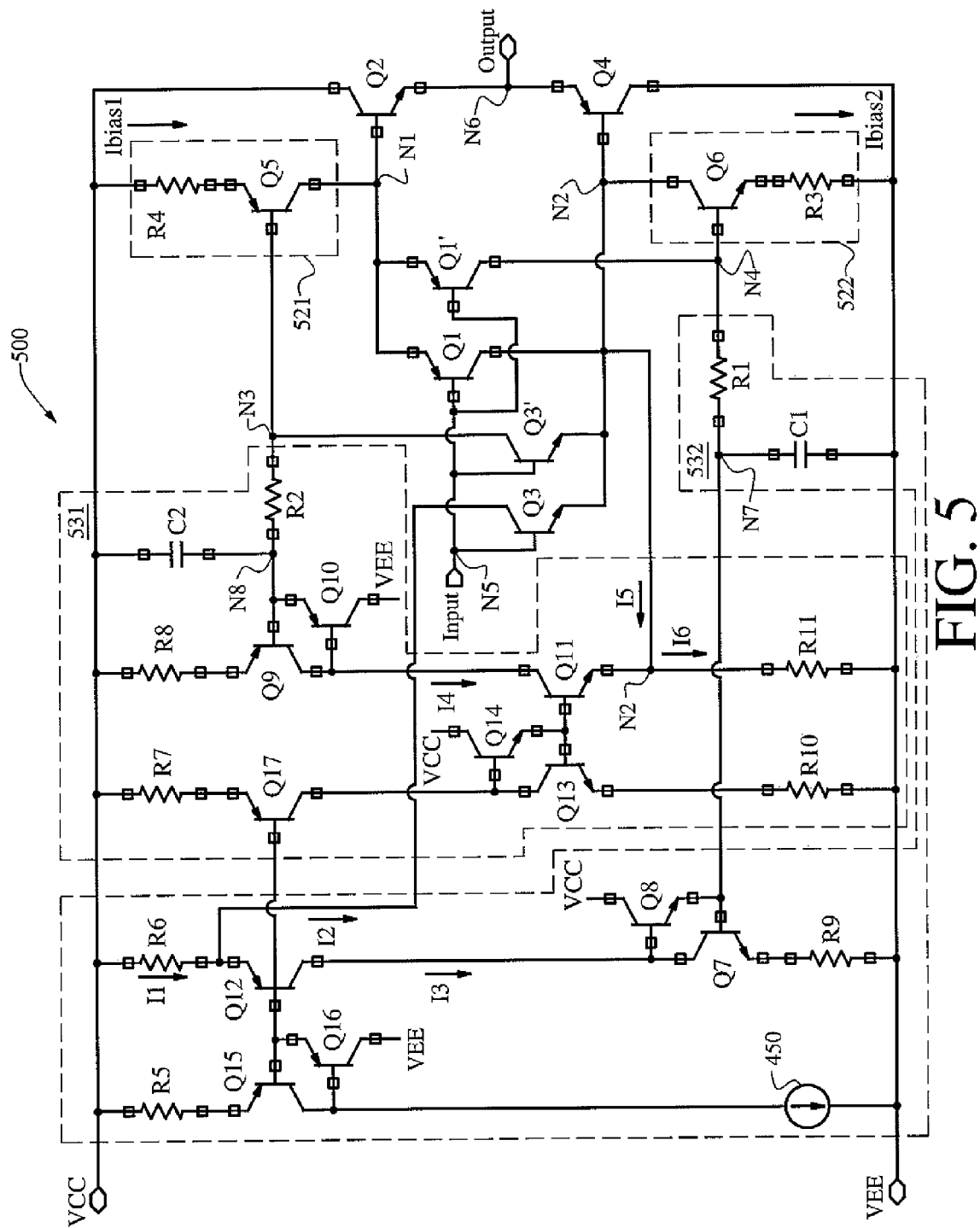
FIG. 5 shows a block diagram of an embodiment of the unity gain buffer of FIG. 4, arranged in accordance with aspects of the invention.

FIG. 5 shows a block diagram of an embodiment of the unity gain buffer 500 driving a load representing by RLOAD. Unity gain buffer 500 may be employed as an embodiment of unity gain buffer 400 of FIG. 3. Bias current source 521 further includes resistor R4. Bias current source 522 further includes resistor R3. Bias control circuit 532 further includes resistors R5, R6, and R9; transistor Q12, Q15, and Q16; and current source 450. Bias control circuit 531 further includes resistors R7, R8, R10, and R11; and transistors Q11, Q13, Q14, and Q17.

For a positively going input voltage Input, when the magnitude of input voltage Input increases, the base current of transistor Q2 increases, which causes the emitter current of transistor Q1 to decrease, which in turn causes current I5 to decrease, which in turn causes current I4 to increases. Since current I4 is mirrored to provide current Ibias1 (subject to the delay), current Ibias1 is increased after the delay.

For a negatively going input, when the input voltage decreases (goes to a more negative value), the base current of Q4 increases, which causes the emitter current of transistor Q4 to decrease, which in turn causes current I2 to decrease, which in turn causes current I3 to increase. Since current I3 is mirrored to provide current Ibias2 (subject to the delay), current Ibias2 is increased after the delay.

Additionally, current source 450 provides a fixed current that does not change with the input voltage. The current provided by current source 450 is mirrored by current mirror Q15/Q12 in bias control circuit 531, and is mirrored by current mirror Q15/Q17 in bias current circuit 532.

As discussed above, bias control circuit 531 is arranged to adjust bias current source 521 so that, if input voltage Input is greater than zero, Ibias1=A+B*Input, where A and B are positive constants. If input voltage Input is zero volts or less, Ibias1=A. Similarly, bias control circuit 132 is arranged to adjust bias current source 122 so that, if input voltage Input is less than zero, Ibias2=A+B*|Input|, where A and B are positive constants. If input voltage Input is zero volts or more, Ibias2=A. The current "A" is determined by current source 450 and the current mirror ratios. In an embodiment in which the current mirrors are all 1:1, the current provided by current source 450 is "A".

Unity gain buffer 500 may be used in many applications. One possible application for unity gain buffer 500 is in a class AB audio amplifier driving speaker load. Using unity gain buffer 500 in a class AB audio amplifier driving speaker load allows less quiescent current in the amplifier, so that less heating occurs in the amplifier. However, the invention is not limited to audio amplifiers, and unity gain amplifier 500 may be used in many other applications.

The above specification, examples, and data provide a description of the manufacture and use of the composition of the invention. Since many embodiments of the invention can be made without departing from the spirit and scope of the invention, the invention also resides in the claims hereinafter appended.

What is claimed is:

1. A circuit for buffering, comprising:
a unity gain buffer having at least an input and an output, wherein the unity gain buffer includes:
   a first translinear loop that is coupled between the input of the unity gain buffer and the output of the unity gain buffer, wherein the first translinear loop includes a first translinear element and a second translinear element;
   a second translinear loop that is coupled between the input of the unity gain buffer and the output of the unity gain buffer, wherein the second translinear loop includes a third translinear element and a fourth translinear element;
   a first bias current source that is arranged to provide a first bias current to the first translinear loop, wherein the first bias current source is arranged to provide the first bias current such that, if an input voltage at the input of the unity gain buffer is greater than zero, the first bias current includes a component that is proportional to the input voltage; and
   a second bias current source that is arranged to provide a second bias current to the second translinear loop, wherein the second bias current source is arranged to provide the second bias current such that, if the input voltage is less than zero, the second bias current includes a component that is proportional to a magnitude of the input voltage.

2. The circuit of claim 1, wherein
the unity gain buffer further includes:
   circuitry that is arranged to cause a temporary increase in the first bias current if the input voltage is positive and increasing; and
   circuitry that is arranged to cause a temporary increase in the second bias current if the input voltage is negative and decreasing.

3. The circuit of claim 2, wherein
the first bias control circuit further includes delay circuitry that is arranged to cause a delay in adjusting the first bias current based on a change in the input voltage, such that the delay is longer in duration than the temporary increase in the first bias current; and
wherein the second bias control circuit further includes delay circuitry that is arranged to cause a delay in adjusting the second bias current based on a change in the input voltage, such that the delay caused by the delay circuitry of the second bias control circuitry is longer in duration than the temporary increase in the second bias current.

4. The circuit of claim 2, wherein
the circuitry that is arranged to cause a temporary increase in the first bias current if the input voltage is positive and increasing is a transistor, and
wherein the circuitry that is arranged to cause a temporary increase in the second bias current if the input voltage is negative and decreasing is another transistor.

5. The circuit of claim 4, wherein
the second translinear element and the fourth translinear element form an output stage that provides the output signal;
the transistor is further arranged to briefly reduce a drive strength of the fourth translinear element if the input voltage is positive and increasing; and
wherein said another transistor is further arranged to briefly reduce a drive strength of the second translinear element if the input voltage is negative and decreasing.

6. A circuit for buffering, comprising:
a unity gain buffer having at least an input and an output, wherein the unity gain buffer includes:
   a first bipolar transistor having at least a base that is coupled to the input of the unity gain buffer, and an emitter that is coupled to a first node;
   a second bipolar transistor having at least a base that is coupled to the first node, and an emitter that is coupled to the output of the unity gain buffer;
   a third bipolar transistor having at least a base that is coupled to the input of the unity gain buffer, and an emitter that is coupled to a second node;
   a fourth bipolar transistor having at least a base that is coupled to the second node, and an emitter that is coupled to the output of the unity gain buffer;
   a first bias current source having an output that is coupled to the first node, wherein the first bias current source is arranged to provide a first bias current at the output of the first bias current source such that, if an input voltage at the input of the unity gain buffer is greater than zero, the first bias current includes a component that is proportional to the input voltage; and
   a second bias current source having an output that is coupled to the second node, wherein the second bias current source is arranged to provide a second bias current at the output of the second bias current source such that, if the input voltage is less than zero, the second bias current includes a component that is proportional to a magnitude of the input voltage.

7. The circuit of claim 6, wherein
the unity gain buffer further includes:
- a first bias control circuit having at least an output that is coupled to a control input of the first bias current source, wherein the first bias control circuit is arranged to control the first bias current source such that, if an input voltage at the input of the unity gain buffer is greater than zero, the first bias current includes a component that is proportional to the input voltage; and
- a second bias control circuit having at least an output that is coupled to a control input of the second bias current source, wherein the second bias control circuit is arranged to control the second bias current source such that, if the input voltage is less than zero, the second bias current includes a component that is proportional to a magnitude of the input voltage.

8. The circuit of claim 7, wherein
the unity gain buffer further includes:
- a fifth bipolar transistor having at least a base that is coupled to the input of the unity gain buffer, an emitter that is coupled to the first node, and a collector that is coupled to the control input of the second bias current source; and
- a sixth bipolar transistor having at least a base that is coupled to the input of the unity gain buffer, an emitter that is coupled to the second node, and a collector that is coupled to the control input of the first bias current source.

9. The circuit of claim 8, wherein
the first and second bias control circuits enable a full voltage swing for the output voltage while having a relatively low quiescent current, and wherein the fifth bipolar transistor and the sixth bipolar transistor enable a relatively high switching speed for output voltage switching while having a relatively low quiescent current.

10. The circuit of claim 7, wherein
the first bias control circuit further includes delay circuitry that is arranged to cause a delay in adjusting the first bias current based on a change in the input voltage; and
wherein the second bias control circuit further includes delay circuitry that is arranged to cause a delay in adjusting the second bias current based on a change in the input voltage.

11. The circuit of claim 10, wherein the delay circuitry in the first bias control circuit includes a low-pass filter, and wherein the delay circuitry in the second bias control circuit includes another low-pass filter.

12. A method for buffering, comprising:
employing a unity gain buffer to provide an output voltage from an input voltage, wherein the unity gain buffer includes a first translinear loop that is coupled between the input of the unity gain buffer and the output of the unity gain buffer, and a second translinear loop that is coupled between the input of the unity gain buffer and the output of the unity gain buffer; wherein the first translinear loop includes a first translinear element and a second translinear element; and wherein the second translinear loop includes a third translinear element and a fourth translinear element;
providing a first bias current to the first translinear loop;
providing a second bias current to the second translinear loop;
providing the first bias current based on a first adjustment such that:
  if the input voltage is less than or equal to zero
    the first bias current corresponds to a constant value,
  else
    the first bias current corresponds to the constant value plus a value that is proportional to the input voltage; and
providing the second bias current such that:
  if the input voltage is greater than or equal to zero
    the second bias current corresponds to a constant value,
  else
    the first bias current corresponds to the constant value plus a value that is proportional to the magnitude of the input voltage.

13. The method of claim 12, further comprising:
briefly reducing a drive strength of the fourth translinear element if the input voltage is positive and increasing; and
briefly reducing a drive strength of the second translinear element if the input voltage is negative and decreasing.

14. The method of claim 12, further comprising:
providing a second adjustment to the first bias current by temporarily increasing the first bias current if the input voltage is positive and increasing; and
providing a second adjustment to the second bias current by temporarily increasing the second bias current if the input voltage is negative and decreasing.

15. The method of claim 13, further comprising:
causing a delay before causing the first adjustment to the first bias voltage such that, if the input voltage changes, changing the first bias voltage based on the first adjustment is delayed by a duration that is greater than a duration of the temporary increase in the first bias current;
causing another delay before causing the first adjustment to the second bias voltage such that, if the input voltage changes, changing the second bias voltage based on the first adjustment is delayed by a duration that is greater than a duration of the temporary increase in the second bias current.

* * * * *

UNITED STATES PATENT AND TRADEMARK OFFICE
CERTIFICATE OF CORRECTION

| | | |
|---|---|---|
| PATENT NO. | : 7,646,244 B1 | Page 1 of 1 |
| APPLICATION NO. | : 12/179458 | |
| DATED | : January 12, 2010 | |
| INVENTOR(S) | : Chang Chia Hsiao et al. | |

It is certified that error appears in the above-identified patent and that said Letters Patent is hereby corrected as shown below:

On the Title page, in field (57), in column 2, in "Abstract", line 6, delete "at" and insert -- as --, therefor.

In column 2, line 22, delete "at" and insert -- as --, therefor.

In column 2, line 25, delete "at" and insert -- as --, therefor.

In column 3, line 33, delete "voltage input" and insert -- voltage Input --, therefor.

In column 5, line 4, delete "Q4" and insert -- Q3 --, therefor.

Signed and Sealed this

Ninth Day of November, 2010

David J. Kappos
*Director of the United States Patent and Trademark Office*